US008586996B2

(12) United States Patent
Nishi

(10) Patent No.: US 8,586,996 B2
(45) Date of Patent: Nov. 19, 2013

(54) SEMICONDUCTOR DEVICE AND METHOD OF MANUFACTURING THE SAME

(75) Inventor: Masahiro Nishi, Kanagawa (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 5 days.

(21) Appl. No.: 13/189,826

(22) Filed: Jul. 25, 2011

(65) Prior Publication Data

US 2012/0018742 A1 Jan. 26, 2012

(30) Foreign Application Priority Data

Jul. 26, 2010 (JP) .................................. 2010-166959

(51) Int. Cl.
*H01L 29/15* (2006.01)
*H01L 31/0312* (2006.01)

(52) U.S. Cl.
USPC 257/77; 257/698; 257/E21.054; 257/E21.585; 438/667

(58) Field of Classification Search
None
See application file for complete search history.

(56) References Cited

U.S. PATENT DOCUMENTS

| 7,233,028 B2 * | 6/2007 | Weeks et al. ..................... 257/98 |
| 2008/0311740 A1 * | 12/2008 | Itou .............................. 438/653 |
| 2009/0001478 A1 * | 1/2009 | Okamoto ....................... 257/382 |
| 2011/0084341 A1 | 4/2011 | Kosaka |

FOREIGN PATENT DOCUMENTS

JP 2009-289935 A 12/2009

* cited by examiner

*Primary Examiner* — Michelle Mandala
*Assistant Examiner* — Shaka White
(74) *Attorney, Agent, or Firm* — Westerman, Hattori, Daniels & Adrian, LLP

(57) ABSTRACT

A semiconductor device includes a SiC substrate, a semiconductor layer formed on the SiC substrate, a via hole penetrating through the SiC substrate and the semiconductor layer, a Cu pad that is formed on the semiconductor layer and is in contact with the via hole, and a barrier layer covering an upper face and side faces of the Cu pad, and restrains Cu diffusion.

12 Claims, 7 Drawing Sheets

US 8,586,996 B2

SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2010-166959 filed on Jul. 26, 2010, the entire contents of which are incorporated herein by reference.

BACKGROUND (i) Technical Field

A certain aspect of embodiments described herein is related to a semiconductor device and a method of manufacturing the semiconductor device. Another aspect of embodiments described herein is related to a semiconductor device including a SiC substrate and a method of manufacturing the same.

(ii) Related Art

A SiC substrate is used as a substrate on which a nitride semiconductor layer such as a gallium nitride (GaN) layer is to be formed. A FET (Field Effect Transistor) such as a high-electron-mobility transistor (HEMT) using a nitride semiconductor is used as a power device that outputs high power at high frequencies. A via hole that penetrates through the substrate from the surface to the bottom surface thereof is formed in the substrate, and the inner face of the via hole is covered with a metal layer. Through the via hole, an electrical connection to a semiconductor device such as an FET formed on the surface of the substrate can be established from the bottom surface of the substrate. With this arrangement, the parasitic impedance can be reduced when an electrical connection to the semiconductor device is established (Japanese Patent Application Publication No. 2009-289935).

In a SiC substrate, however, there exist pipe-like defects called "micropipes". Therefore, when a via hole is formed in a SiC substrate from the bottom surface thereof, the etching speed is higher in the vicinities of micropipes in the SiC substrate. As a result of this, the pad that is formed on the surface of the substrate and is exposed through the via hole have large concavities and convexities. In some cases, those concavities and convexities grow to penetrate through the pad.

SUMMARY

According to an aspect of the present invention, there is provided a semiconductor device including: a SiC substrate; a semiconductor layer formed on the SiC substrate; a via hole penetrating through the SiC substrate and the semiconductor layer; a Cu pad that is formed on the semiconductor layer and is in contact with the via hole; and a barrier layer covering an upper face and side faces of the Cu pad, and restrains Cu diffusion.

DETAILED DESCRIPTION

The following is a description of an embodiment of the present invention, with reference to the accompanying drawings.

Figure 1:
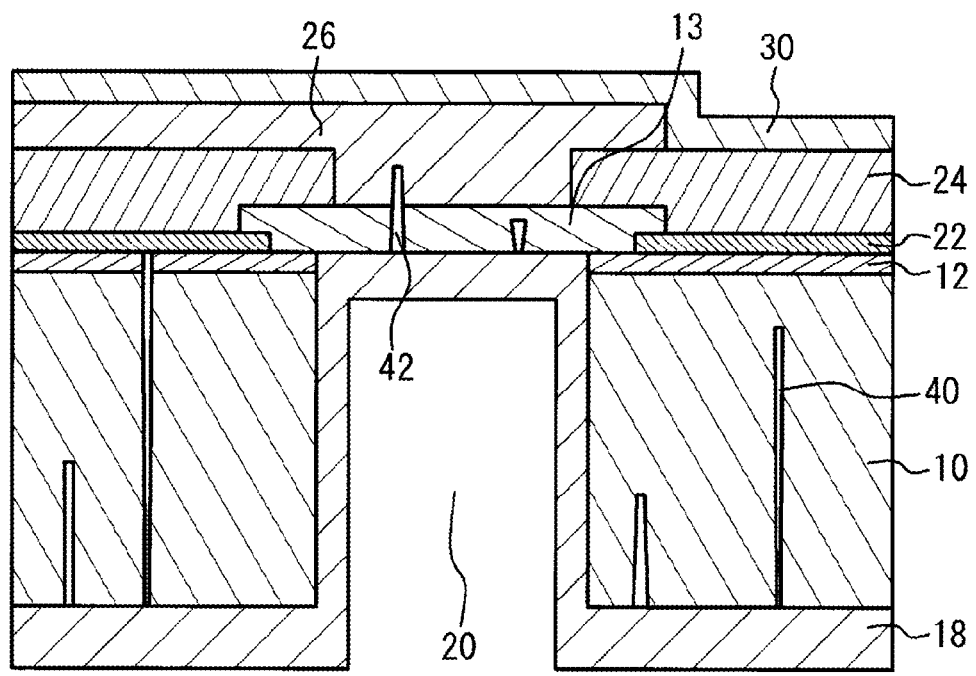
FIG. 1 is a cross-sectional view of a semiconductor device according to a comparative example.

FIG. 1 is a cross-sectional view of a semiconductor device according to a comparative example. There exist a large number of micropipes 40 in a SiC substrate 10. A nitride semiconductor layer 12 is formed on the SiC substrate 10. A pad 13 is formed on the nitride semiconductor layer 12. The pad 13 includes a TiW layer and an Au layer in this order, or a Ni layer and an Au layer in this order, for example, when seen from the SiC substrate 10. An inorganic insulating film 22 is formed on the nitride semiconductor layer 12 other than the portion on which the pad 13 is formed. An inorganic insulating film 24 is formed to cover the pad 13. The inorganic insulating films 22 and 24 are silicon nitride films, for example. An opening is formed in the inorganic insulating film 24, and an interconnect 26 is formed on the upper face of the pad 13 in the opening and on the inorganic insulating film 24. The interconnect 26 is made of Au, for example. A passivation film 30 is formed to cover the interconnect 26. The passivation film 30 is made of silicon nitride, for example. A via hole 20 vertically penetrating through the SiC substrate 10 and the nitride semiconductor layer 12 (from the lower face to the pad 13) is formed in the SiC substrate 10 and the nitride semiconductor layer 12. A lower-face metal layer 18 is formed along the inner face of the via hole 20. The lower-face metal layer 18 is in contact with the pad 13. The lower-face metal layer 18 includes a Ni film and a Au film in this order, for example, when seen from the SiC substrate 10.

If the etching selectivity between the SiC substrate 10 and the pad 13 is not high, the pad 13 is etched when etching is performed on the SiC substrate 10 to form the via hole 20. As a result, holes 42 are formed as shown in FIG. 1. This is because the etched amounts in the vicinities of the micropipes 40 become particularly large, if the portions of the SiC substrate in the vicinities of the micropipes 40 are thin, or if the micropipes 40 penetrate through the SiC substrate 10.

Figure 2:
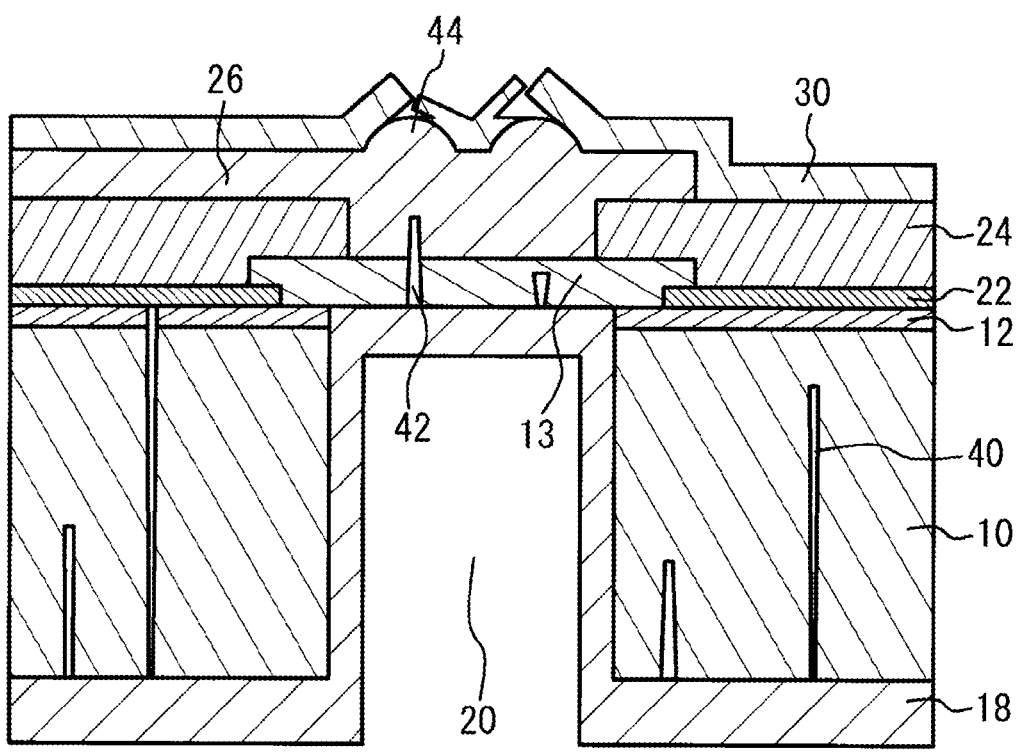
FIG. 2 is a cross-sectional view showing bulges formed in the pad.

FIG. 2 is a cross-sectional view showing bulges formed in the pad 13. If the air or a plating solution or the like remains in a hole 42 penetrating through the pad 13, the plating solution or the like expands at the time of a heat treatment, and the interconnect 26 expands as shown in FIG. 2 (regions 44).

Figure 3:
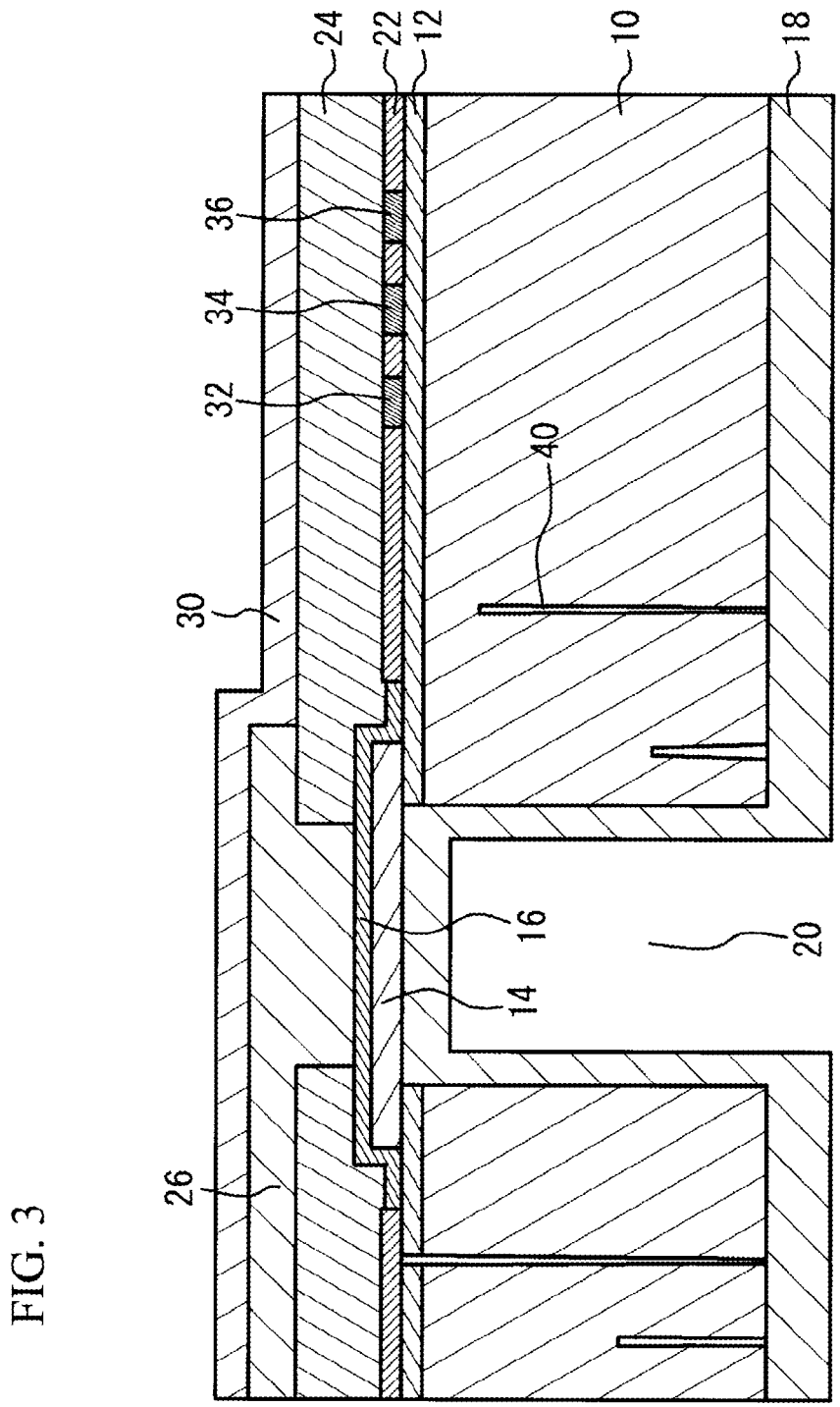
FIG. 3 is a cross-sectional view of a semiconductor device according to a first embodiment.

A first embodiment to solve the above described problem is now described. FIG. 3 is a cross-sectional view of a semiconductor device according to the first embodiment. A Cu pad 14 in contact with the via hole 20 is formed on the nitride semiconductor layer 12. The Cu pad 14 has a Ti layer as a contact layer, and a Cu layer formed on the Ti layer, for example. The film thickness of the Ti layer is 10 nm, for example, and the film thickness of the Cu layer is 100 nm, for example. A barrier layer 16 is formed to cover the upper face and the side faces of the Cu pad 14. The barrier layer 16 functions to restrain Cu diffusion, and is made of TiWN, TiW, Ta, TaN, Pt, or Ni, for example. A FET including a source electrode 32, a gate electrode 34, and a drain electrode 36 is formed on the nitride semiconductor layer 12. The source electrode 32 is connected to the Cu pad 14. The other aspects of this embodiment are the same as those shown in FIG. 1, and therefore, explanation of them is omitted herein.

Cu has a much higher selectivity than Ni or the like when etching is performed on the SiC substrate 10. Accordingly, in the first embodiment, the formation of holes in the pad as shown in FIG. 1 can be restrained. Also, Cu serves as a donor, diffusing into the nitride semiconductor layer 12. Furthermore, Cu easily has an eutectic reaction with Au or the like. According to the first embodiment, the barrier layer 16 covers the upper face and the side faces of the Cu pad 14, and therefore, diffusion of Cu into the nitride semiconductor layer 12 can be restrained. Also, reactions between the Cu pad 14 and the interconnect 26 can be restrained. The barrier layer 16 preferably cover the entire upper face and the entire side faces of the Cu pad 14.

The nitride semiconductor layer 12, the source electrode 32, the gate electrode 34, and the drain electrode 36 are covered with the inorganic insulating film 24, but the Cu pad 14 is not. With this arrangement, diffusion of Cu into the nitride semiconductor layer 12 can be restrained. Also, Cu can be prevented from adhering to the source electrode 32, the gate electrode 34, and the drain electrode 36.

Figure 4A:
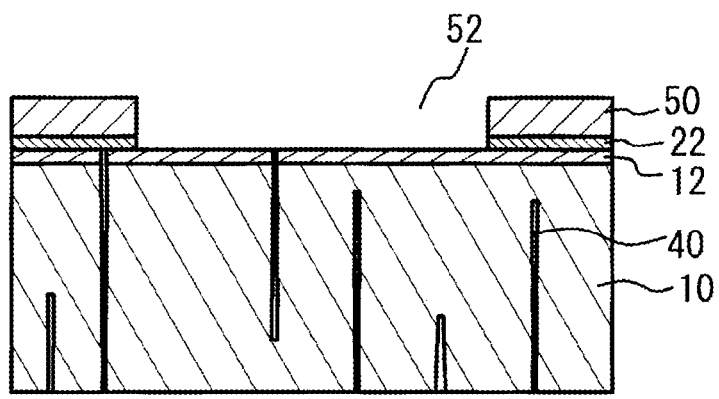
FIGS. 4A through 4C are first through third cross-sectional views illustrating a method of manufacturing the semiconductor device according to the first embodiment.

FIGS. 4A through 7 are cross-sectional views illustrating a method of manufacturing the semiconductor device according to the first embodiment. As shown in FIG. 4A, the nitride semiconductor layer 12 is formed on the SiC substrate 10. As the nitride semiconductor layer 12, an AlN buffer layer, a GaN channel layer, an n-type AlGaN electron supply layer, and an n-type GaN cap layer are formed in this order. The inorganic insulating film 22 is formed on the nitride semiconductor layer 12. The inorganic insulating film 22 is a silicon nitride film, for example, and is formed by CVD (Chemical Vapor Deposition). Part of the inorganic insulating film 22 is removed, and the source electrode and the drain electrode are formed (not shown). A photoresist 50 having an opening 52 is formed on the inorganic insulating film 22. With the photoresist 50 serving as a mask, etching is performed on the inorganic insulating film 22.

Figure 4B:
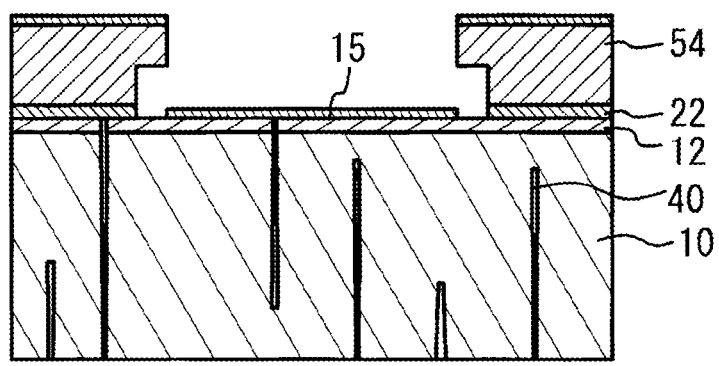
Figure 4C:
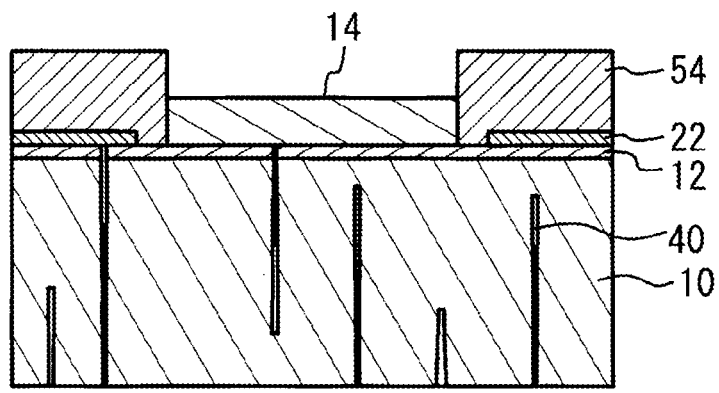

As shown in FIG. 4B, the photoresist 50 is removed. A two-layer photoresist 54 is then formed. As a seed layer 15, a Ti film having a film thickness of 10 nm and a Cu film having a film thickness of 10 nm are deposited, for example. Liftoff is then performed as shown in FIG. 4C. A photoresist 54 having an opening 53 to expose the seed layer 15 is then formed. A Cu layer having a film thickness of 500 nm is formed inside the opening 53 by electroless plating. In this manner, the Cu pad 14 is formed on the nitride semiconductor layer 12. In FIG. 4C and the following figures, the seed layer 15 is not shown. If the Cu film deposited in FIG. 4B is thick enough to function as the etching stopper for the SiC substrate 10, the plating shown in FIG. 4C may not be performed.

Figure 5A:
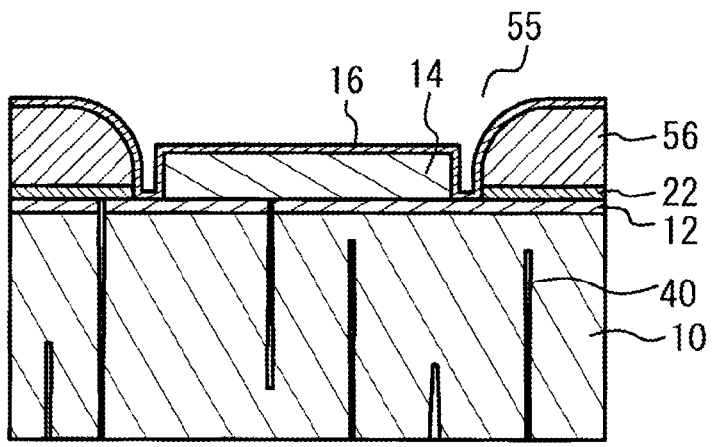
FIGS. 5A through 5C are fourth through sixth cross-sectional views illustrating the method of manufacturing the semiconductor device according to the first embodiment.
Figure 5B:
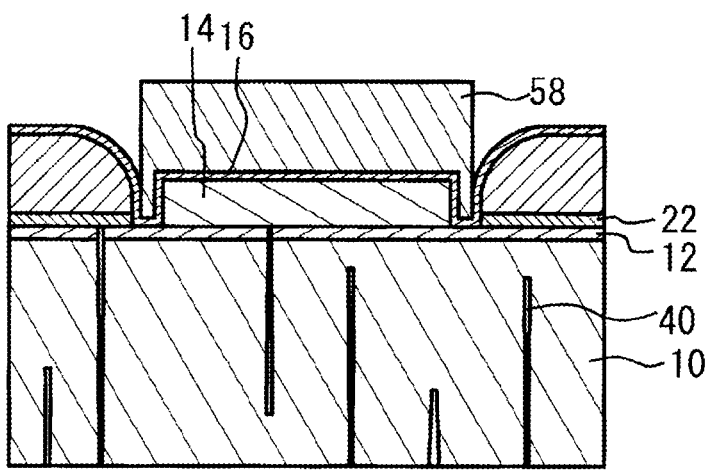
Figure 5C:
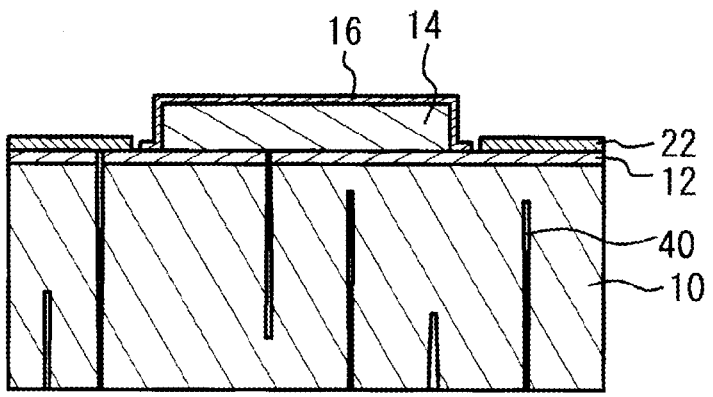

As shown in FIG. 5A, the photoresist 54 is removed. A photoresist 56 having an opening 55 to expose the Cu pad 14 is then formed. A thermal process is performed to round the photoresist 56. As for the barrier layer 16, TiN is sputtered, for example. As shown in FIG. 5B, a photoresist 58 is then formed to cover the Cu pad 14. Etching is performed on the barrier layer 16, except for the portions located on the upper face and the side faces of the Cu pad 14. Since the photoresist 56 is rounded, burrs are not formed in the barrier layer 16. As shown in FIG. 5C, the photoresists 56 and 58 are then removed.

Figure 6A:
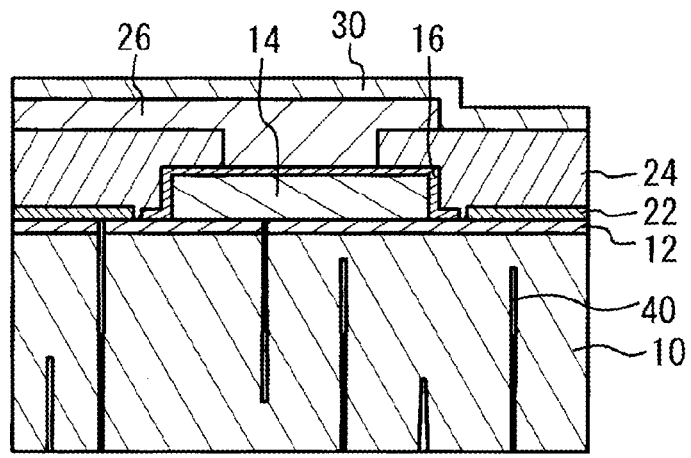
FIGS. 6A through 6C are seventh through ninth cross-sectional views illustrating the method of manufacturing the semiconductor device according to the first embodiment.

As shown in FIG. 6A, part of the inorganic insulating film 22 is removed, and the gate electrode (not shown) is formed. The inorganic insulating film 24 is formed on the entire surface. A contact hole is formed in the inorganic insulating film 24. The interconnect 26 is formed to be in contact with the barrier layer 16 through the contact hole. The interconnect 26 includes a TiW film and an Au film in this order, for example, when seen from the barrier layer 16. The passivation film 30 is then formed on the entire surface of the interconnect 26.

Figure 6B:
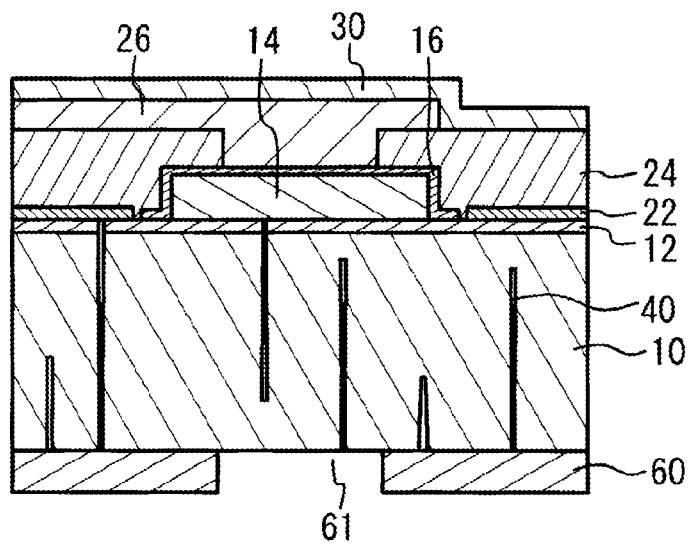
Figure 6C:
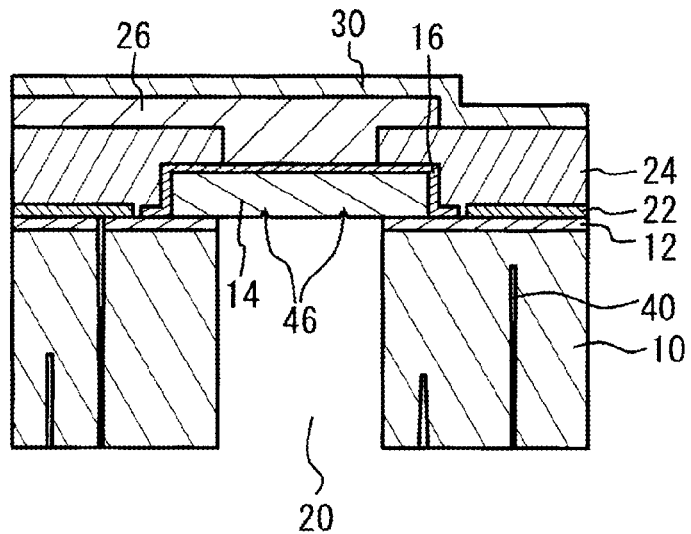

As shown in FIG. 6B, a mask 60 having an opening 61 below the Cu pad 14 is formed under the lower face of the SiC substrate 10. The mask 60 is made of Ni, for example. With the mask 60 serving as the mask, dry etching is performed on the SiC substrate 10, as shown in FIG. 6C. Through the dry etching, the via hole 20 is formed in contact with the Cu pad 14. In the etching, a fluorine-based etching gas is used, for example. The fluorine-based etching gas contains $CF_4$, $CHF_3$, $SF_6$, or the like. A mixed gas of $SF_6$ and $O_2$ is used, for example. As the etching device, an ICP (inductively-coupled plasma) etching device that can provide a high plasma density is used. With this arrangement, high-speed etching can be performed on the SiC substrate 10. Furthermore, where a mixed gas of $SF_6$ and $O_2$ is used, the selectivity between Cu and SiC is as high as 1:1000 or even higher. Therefore, even though the micropipes 40 exist in the SiC substrate 10, only small concave portions 46 are formed in the lower face of the Cu pad 14. After that, the mask 60 is removed.

Figure 7:
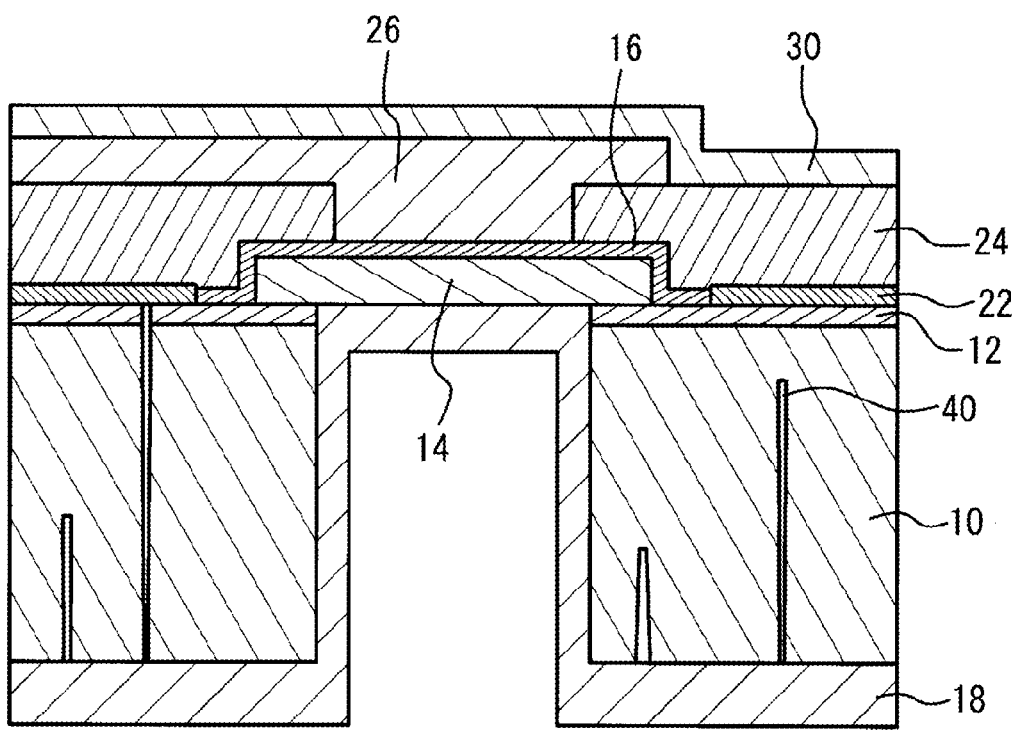
FIG. 7 is a tenth cross-sectional view illustrating the method of manufacturing the semiconductor device according to the first embodiment.

As shown in FIG. 7, the lower-face metal layer 18 that is buried in the via hole 20 and is in contact with the Cu pad 14 is formed by a sputtering technique and a plating technique. The lower-face metal layer 18 includes a barrier layer made of TiWN and a plating layer made of Au, for example. The barrier layer functions to restrain eutectic reactions between Cu and Au, and may be made of TiW, Ta, TaN, Pt, or Ni, instead of TiWN. Through the above procedures, the semiconductor device according to the first embodiment is completed.

According to the first embodiment, formation of concavities and convexities in the lower face of the Cu pad 14 is restrained when the via hole 20 is formed, as shown in FIG. 6C. Accordingly, the bulges in the interconnect 26 shown in FIG. 2 can be avoided, for example.

Prior to the procedure for forming the Cu pad 14, the inorganic insulating film 22 is formed on the entire surface of the nitride semiconductor layer 12, as shown in FIG. 4A. The inorganic insulating film 22 is removed from the region on which the Cu pad 14 is to be formed. As shown in FIGS. 4B and 4C, in the procedure for forming the Cu pad 14, the Cu pad 14 is formed on the region from which the inorganic insulating film 22 has been removed. As described above, the inorganic insulating film 22 is formed on the entire surface of the nitride semiconductor layer 12 prior to the formation of the Cu pad 14, so that Cu diffusion into the nitride semiconductor layer 12 can be restrained in the procedure for forming the Cu pad 14. It should be noted that the insulating film formed on the entire surface of the nitride semiconductor layer 12 may be an organic insulating film, but is preferably an inorganic insulating film that is such a dense film as not to allow Cu diffusion.

Although the semiconductor layer is the nitride semiconductor layer 12 in the above described example of the first embodiment, some other semiconductor layer may be used. However, the nitride semiconductor layer 12 is preferred as a semiconductor layer that can be formed on the SiC substrate 10. A nitride semiconductor is a semiconductor containing nitrogen, such as InN, AlN, InGaN, InAlN, or AlInGaN.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
a SiC substrate;
a semiconductor layer formed on the SiC substrate;
a via hole penetrating through the SiC substrate and the semiconductor layer;
a Cu pad that is formed on the semiconductor layer and is in contact with the via hole;
a barrier layer covering an upper face and side faces of the Cu pad;
a source electrode, a gate electrode and a drain electrode formed on the semiconductor layer, the source electrode being connected to the Cu pad that is different from the source electrode; and
wherein the barrier layer directly contacts with the semiconductor layer adjacent to the side faces of the Cu layer.

2. The semiconductor device as claimed in claim 1, wherein the semiconductor layer includes a multi layered structure.

3. The semiconductor device as claimed in claim 1, wherein the barrier layer is made of one of TiWN, TiW, Ta, TaN, Pt, and Ni.

4. The semiconductor device as claimed in claim 1, further comprising a lower-face metal layer that is formed on an inner face of the via hole, wherein the lower-face metal is in contact with the Cu pad.

5. The semiconductor device as claimed in claim 1, wherein the semiconductor layer is a nitride semiconductor layer.

6. A method of manufacturing a semiconductor device, comprising:
forming a source electrode, a gate electrode and a drain electrode on a semiconductor layer formed on an upper face of a SiC substrate;
forming a Cu pad on the semiconductor layer so that the source electrode is connected to the Cu pad that is different from the source electrode;
forming a barrier layer covering an upper face and side faces of the Cu pad;
forming a via hole from a lower face of the SiC substrate, that penetrates through the SiC substrate and reaches to the Cu pad; and
wherein the barrier layer directly contacts with the semiconductor layer adjacent to the side faces of the Cu layer.

7. The method as claimed in claim 6, wherein the forming the via hole includes performing etching of the SiC substrate by a fluorine-based gas.

8. The method as claimed in claim 6, further comprising:
forming an insulating film on an entire surface of the semiconductor layer; and
removing the insulating film from a region on which the Cu pad is to be formed,
the forming the insulating film and the removing the insulating film being performed prior to the forming the Cu pad.

9. The method as claimed in claim 6, wherein the semiconductor layer includes a multi layered structure.

10. The method as claimed in claim 9, wherein the semiconductor layer is a nitride semiconductor layer.

11. The semiconductor device as claimed in claim 2, wherein the semiconductor layer has at least one of GaN, InN, AlN, InGaN, InAlN, or AlInGaN.

12. The method as claimed in claim 9, wherein the semiconductor layer has at least one of GaN, InN, AlN, InGaN, InAlN, or AlInGaN.

* * * * *